United States Patent
Song et al.

(10) Patent No.: US 9,666,481 B2
(45) Date of Patent: May 30, 2017

(54) REDUCED HEIGHT M1 METAL LINES FOR LOCAL ON-CHIP ROUTING

(71) Applicant: QUALCOMM Incorporated, San Diego, CA (US)

(72) Inventors: Stanley Seungchul Song, San Diego, CA (US); Choh Fei Yeap, San Diego, CA (US); Zhongze Wang, San Diego, CA (US); Niladri Mojumder, San Diego, CA (US); Mustafa Badaroglu, Leuven (BE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/141,198

(22) Filed: Apr. 28, 2016

(65) Prior Publication Data

US 2016/0240437 A1    Aug. 18, 2016

Related U.S. Application Data

(63) Continuation of application No. 14/206,360, filed on Mar. 12, 2014, now Pat. No. 9,349,686.

(51) Int. Cl.
*H01L 21/768*    (2006.01)
*H01L 23/528*    (2006.01)
(Continued)

(52) U.S. Cl.
CPC .. *H01L 21/76879* (2013.01); *H01L 21/02167* (2013.01); *H01L 21/76829* (2013.01);
(Continued)

(58) Field of Classification Search
CPC combination set(s) only.
See application file for complete search history.

(56) References Cited

U.S. PATENT DOCUMENTS

| 6,146,978 A | 11/2000 | Michael et al. |
|---|---|---|
| 7,101,783 B2 | 9/2006 | Kim et al. |

(Continued)

FOREIGN PATENT DOCUMENTS

| JP | 2001144098 A | 5/2001 |
|---|---|---|
| JP | 2013187350 A | 9/2013 |
| KR | 20080002027 A | 1/2008 |

OTHER PUBLICATIONS

Cabral C., et al., "Metallization Opportunities and Challenges for Future Back-End-of-the-Line Technology", Advanced Metallization Conference 2010, IBM, Oct. 5-7, 2010 , pp. 13-15, Retrieved from the Internet: URL: http://www.sematech.org/meetings/archives/3d/8964/pres/Cabral.pdf [retrieved on Jul. 6, 2015].

(Continued)

*Primary Examiner* — Mamadou Diallo
(74) *Attorney, Agent, or Firm* — Alan Gordon; Kenneth Vu

(57) ABSTRACT

Systems and methods are directed to an integrated circuit comprising a reduced height M1 metal line formed of an exemplary material with lower mean free path than Copper, for local routing of on-chip circuit elements of the integrated circuit, wherein the height of the reduced height M1 metal line is lower than a minimum allowed or allowable height of a conventional M1 metal line formed of Copper. The exemplary materials for forming the reduced height M1 metal line include Tungsten (W), Molybdenum (Mo), and Ruthenium (Ru), wherein these exemplary materials also exhibit lower capacitance and lower RC delays than Copper, while providing high electromigration reliability.

5 Claims, 3 Drawing Sheets

(51) Int. Cl.
*H01L 23/532* (2006.01)
*H01L 21/02* (2006.01)

(52) U.S. Cl.
CPC .. *H01L 21/76841* (2013.01); *H01L 21/76843* (2013.01); *H01L 21/76883* (2013.01); *H01L 21/76895* (2013.01); *H01L 23/528* (2013.01); *H01L 23/5283* (2013.01); *H01L 23/53257* (2013.01); *H01L 2924/0002* (2013.01)

(56) References Cited

U.S. PATENT DOCUMENTS

| | | |
|---|---|---|
| 2003/0080433 A1 | 5/2003 | Hanaoka et al. |
| 2003/0140857 A1 | 7/2003 | Umotoy et al. |
| 2008/0081453 A1 | 4/2008 | Kim et al. |
| 2009/0206447 A1 | 8/2009 | Basker et al. |
| 2012/0306081 A1 | 12/2012 | Ishizaki et al. |
| 2013/0069238 A1 | 3/2013 | Usami et al. |
| 2013/0207269 A1 | 8/2013 | Oshida |
| 2014/0073128 A1 | 3/2014 | Jong |
| 2014/0284801 A1 | 9/2014 | Kitamura et al. |
| 2014/0374904 A1 | 12/2014 | Matsumoto et al. |
| 2015/0262930 A1 | 9/2015 | Song et al. |

OTHER PUBLICATIONS

Hirose F., et al., "Tungsten Deposition by Metal-Chloride-Reduction Chemical Vapor Deposition", Electrochemical and Solid State Letters, vol. 14, No. 7, Jul. 2011, XP002742119, pp. H251-H253, ISSN: 1099-0062, DOI: 10.1149/1.3575164.

International Search Report and Written Opinion—PCT/US2015/019850—ISA/EPO—Jul. 22, 2015.

Liu F., et al., "Subtractive W Contact and Local Interconnect Co-integration (CLIC)", 2013 IEEE International Interconnect Technology Conference (IITC), Jun. 13, 2013, XP032491188, 3 Pages. ISBN: 978-1-4799-0438-9.

REDUCED HEIGHT M1 METAL LINES FOR LOCAL ON-CHIP ROUTING

CLAIM OF PRIORITY UNDER 35 U.S.C. §120

The present Application for Patent is a Divisional of patent application Ser. No. 14/206,360 entitled "REDUCED HEIGHT M1 METAL LINES FOR LOCAL ON-CHIP ROUTING" filed Mar. 12, 2014, pending, and assigned to the assignee hereof and hereby expressly incorporated herein by reference in its entirety.

FIELD OF DISCLOSURE

Disclosed embodiments are directed to M1 metal lines for local on-chip routing of logical circuit elements in integrated circuits, where the M1 metal lines are configured for low RC delay while ensuring high electromigration reliability.

BACKGROUND

As semiconductor device technology evolves, there is an ever-present need for shrinking all aspects of semiconductor device sizes. However, design and manufacture of various components of semiconductor devices involves different materials and processes, and accordingly, different components scale differently. For example, while sizes of logic and memory cells on a semiconductor chip shrink rapidly as they evolve into the low nanometer and sub-nanometer scales, it is very challenging to shrink the interconnections between these cells at comparable pace. The interconnections are predominantly made up of metal lines, typically formed by materials such as Copper (Cu). Decreasing the size, in terms of thickness or cross sectional area, of these metal lines leads to various issues.

More specifically, for short interconnections between on-chip logic and/or memory elements, it is preferable to use a metal line on a same layer as these elements in order to improve speed. Typically, such interconnections are formed on a so called first level, or level 1 or layer 1, and are generally referred to as metal 1 (M1) metal lines. Longer routing paths are formed in different layers, such as, levels 2, 3, 4, and beyond, and interconnections between these higher level metal lines (e.g., M2, M3, M4, etc.) involve the use of inter-level vias which introduce additional delay. Accordingly for local routing, for example, for short interconnections which are required to have a small critical path, M1 interconnections are preferred.

The delay introduced by a metal line is proportional to a product of resistance (R) and capacitance (C) of the metal line, and is usually referred to as a resistance-capacitance or "RC" delay. As the size of the metal line is reduced, both resistance and capacitance of the metal line increase. In the case of M1 metal lines, it seen that in order to reduce the RC delay of M1 metal lines, reducing the capacitance is more important than reducing the resistance, because increasing capacitance tends to have adverse effects on performance of nearby elements, such as neighboring M1 metal lines, logic, memory cells, etc.

Based on process parameters, reducing capacitance of M1 metal lines can be most effectively achieved by reducing the height of the M1 metal lines. However, naively reducing the metal height of M1 metal lines can lead to harmful side-effects. This is because reducing the metal height leads to a smaller cross-sectional area of the M1 metal line, which increases current density. A higher current density affects electromigration reliability. In general, electromigration tends to be a key reliability issue in Cu metallization. Briefly, the issue can be explained with respect to current flowing through a Cu metal line. When high current (or in other words, a large number of electrons) flows through Cu, the Cu atoms can move along with the movement of the electrons. As a result, a void or decrease of Cu atoms may occur in some portions of the Cu metal line, while a hill or increase of Cu atoms may occur in other portions of the Cu metal line, thus leading to failure or loss of reliability, for example in dielectric layers which may be formed adjacent to M1 metal lines formed from Cu in conventional designs.

In an effort to prevent such side-effects and preserve electromigration reliability, existing technology-specific design rules impose restrictions on the minimum size to which M1 metal lines can be shrunk. These rules are based on conventional M1 metal lines formed of Cu, and also take into account the limitations of Cu filling processes needed for forming the M1 metal lines. Accordingly, the conventional M1 metal lines formed from Cu cannot be safely shrunk below these predetermined minimum sizes, and thus, limits are imposed on the overall layout scaling of semiconductor devices. Due to these restrictions on the minimum sizes, the height of the M1 metal line cannot be reduced beyond these restrictive minimum sizes, and therefore, capacitance and RC delays tend to be undesirably high.

SUMMARY

Exemplary embodiments are directed to systems and methods for reduced height M1 metal line for local routing of on-chip circuit elements.

For example, an exemplary embodiment is directed to an integrated circuit comprising a reduced height M1 metal line formed of a material with lower mean free path than Copper, for local routing of on-chip circuit elements of the integrated circuit, wherein a height of the reduced height M1 metal line is lower than a minimum allowed height of a M1 metal line formed of Copper.

Another exemplary embodiment is directed to a method of forming an integrated circuit, the method comprising forming a reduced height M1 metal line from a material with lower mean free path than Copper for local routing of on-chip circuit elements of the integrated circuit, wherein a height of the reduced height M1 metal line is lower than a minimum allowed height of a M1 metal line formed of Copper.

Yet another exemplary embodiment is directed to a method of forming an M1 metal line in an integrated circuit, the method comprising: depositing a SiCN etch stop layer over a substrate, depositing a dielectric layer of low dielectric constant on the substrate, patterning the dielectric layer based on desired dimensions for the M1 metal line, etching a trench based on the pattern, wherein a dimension of the trench corresponds to the desired dimensions for the M1 metal line, and depositing a material for the M1 metal line in the trench, wherein the dimensions for the M1 metal line include a height smaller than a minimum allowable height for a M1 metal line formed of Copper, and a length of the M1 metal line is smaller than a minimum allowable length of a M1 metal line formed of Copper.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
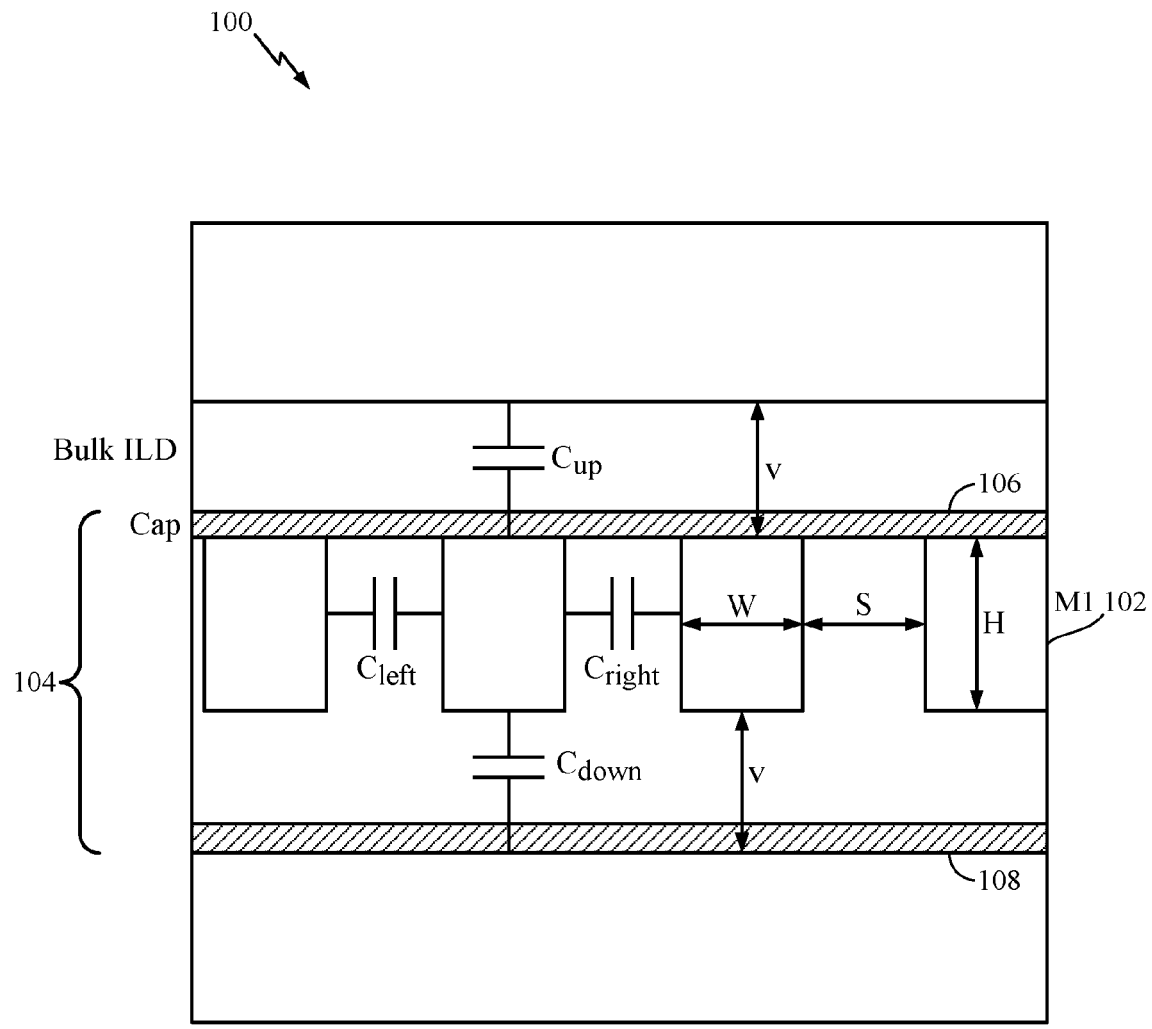
FIG. 1 illustrates a cross-sectional view of an integrated circuit comprising M1 metal lines according to exemplary embodiments.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

One or more embodiments are configured to overcome limitations of conventional routing techniques. More specifically, exemplary embodiments address the limitations of M1 metal lines formed from Copper. For example, M1 metal lines according to the embodiments can be formed from different materials and related processes, which can be safely scaled below minimum prescribed sizes for conventional Cu-based M1 metal lines, and thus, the exemplary M1 metal lines have lower capacitance and lower RC delays without compromising electromigration reliability. Materials for forming exemplary M1 metal lines can include elements with lower mean free path than Cu, such as, Tungsten (W), Molybdenum (Mo), Ruthenium (Ru), etc., which display characteristics of higher electromigration reliability than Cu. Exemplary M1 metal lines can also be scaled to sizes (e.g., in terms of height, width, cross-sectional area, etc), which are lower than minimum allowed sizes for M1 metal lines made of Copper. As employed herein, the phrase "minimum allowed sizes" for Cu refers to design rules for layout of circuit elements in the design and manufacture of integrated circuits, wherein the design rules specify sizes, dimensions, and standards which must be satisfied for the numerous components of the integrated circuits.

While exemplary aspects can pertain to interconnections between logic and/or memory elements, some aspects specifically focus on M1 metal lines for local routing between on-chip logical circuit elements, which tend to require high speed (i.e., low RC delay) interconnections. Once again, it will be recalled that capacitance of the M1 metal lines play a more significant role than resistance in the RC delay of the M1 metal lines. Therefore, exemplary aspects are directed to minimizing the capacitance contribution towards RC delays.

With reference to FIG. 1, a portion of a cross-sectional slice of an integrated circuit 100 is illustrated. The illustrated slice includes a plurality of M1 metal lines 102, running into and out of the page in the depicted view. FIG. 1 can pertain to a back end of line (BEOL) process step, for example. A BEOL is a well recognized part of integrated circuit fabrication where interconnections are formed for connecting the various circuit elements, such as transistors, capacitors, resistors, etc., which may be formed on-chip. M1 metal lines 102 can be used for local routing or interconnections between on-chip logical circuit elements (i.e., on or within a same chip, as opposed to higher level metal lines, such as, M2, M3, etc., which may be employed for connecting multiple chips or connecting off-chip components such as, an off-chip memory, etc.). In addition to forming M1 metal lines for the local routing of on-chip circuit elements, BEOL can include contacts, insulating layers, interlayer dielectrics (ILDs), other metal levels, and bonding sites for chip-to-package connections. Representatively, FIG. 1 includes illustrations of some of these aspects related to process parameters and dimensions.

In the illustrated example, the depicted M1 metal lines 102 may be formed in device layer 104 with cap layers 106 and 108 on first and second sides (e.g., top and bottom sides). Bulk ILD 110 is formed on the first side (above cap layer 106). The dimension "W" represents the width and "H," the height of one of the M1 metal lines 102. The dimension "v" represents height of vias leading to metal lines (e.g., M2, M3, etc., not shown) in layers on first and second sides (above and below cap layers 106 and 108). The dimension "s" depicts the separation or distance between two adjacent M1 metal lines 102. For a given M1 metal line 102, capacitors are formed on at least the depicted sides, denoted as $C_{left}$, $C_{right}$, $C_{down}$, and $C_{up}$.

With the above parameters and dimensions, the capacitance of a M1 metal line 102, denoted as $C_{BEOL}$ can be represented by the following expression, where $k_v$ and $k_h$ are effective dielectric constants in vertical and horizontal directions, and $k_{cap}$ and $k_{ILD}$ are effective dielectric constants of the cap layer 106 and bulk ILD 110, for example.

$$C_{BEOL} = \frac{k_V WL}{v} + \frac{k_h HL}{s} = \frac{k_{cap} WL}{t_{cap}} + \frac{k_{ILD} WL}{t_{ILD}} + \frac{k_h WL}{s}$$

Correspondingly, the resistance, $R_{BEOL}$ is given by the expression, where p is the resistivity of M1 metal line 102:

$$R_{BEOL} = \frac{\rho L}{HW}$$

Based on the above expressions for $C_{BEOL}$ and $R_{BEOL}$, it is seen that reducing the dimension H will lead to a lower RC delay. However, as discussed with reference to conventional technologies relying on Cu for forming M1 metal lines, reducing the dimension H would negatively impact electromigration reliability, due to increased current density. Accordingly, exemplary embodiments recognize that elements with lower mean free path than Cu would not suffer from these limitations seen in elements like Cu. For example, elements such as Tungsten (W), Molybdenum (Mo), and Ruthenium (Ru) exhibit a much lower mean free path than Cu (e.g., mean free path of W, Mo, and Ru can be in the range of ~10 nm). Due to the lower mean free path, it is safe to form M1 metal lines 102 from material such as, W, Mo, or Ru, with decreased height H, which would advantageously lead to low RC delay values while retaining high electromigration reliability. Moreover, it is also seen that capacitance values of capacitors such as $C_{left}$ and $C_{right}$ discussed above tend to be lower for metal lines 102 formed from materials such as W, Mo, or Ru. Thus, electromigration characteristics of the exemplary reduced height M1 metal line 102 may be superior to or equivalent to electromigration characteristics of a conventional M1 metal line formed of Copper; whereas the RC delay characteristics of the exemplary reduced height M1 metal line 102 can be significantly lower than the RC delay values a conventional M1 metal line formed of Copper.

In further aspects, it is also recognized that lower length (L) of exemplary M1 metal lines formed from materials such as W, Mo, and Ru are possible, in comparison to minimum possible (or allowed, per design rules) length of a conventional M1 metal line formed of Copper. Therefore, embodiments also include M1 metal lines formed from materials such as W, Mo, or Ru, of significantly smaller length than lengths of conventional M1 metal lines formed from Cu.

Figure 2:
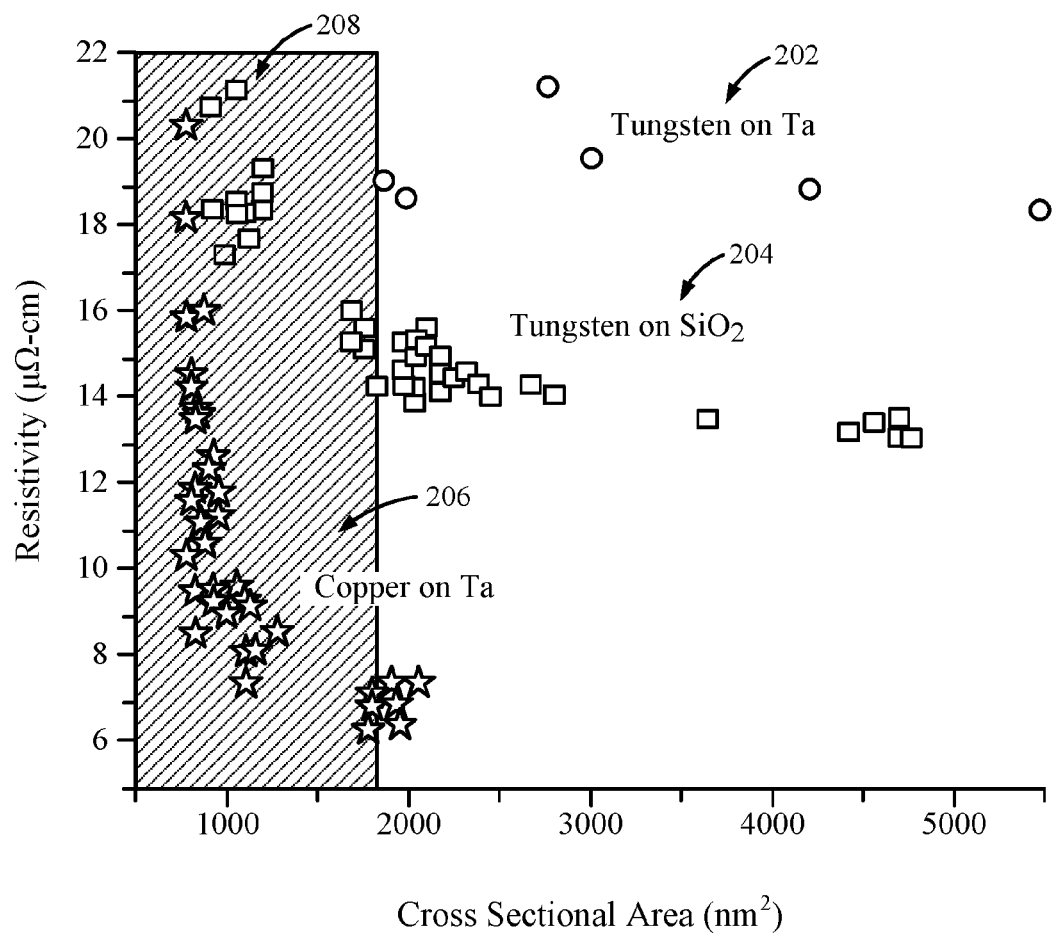
FIG. 2 illustrates plots comparing resistivity of conventional and exemplary materials for formation of M1 metal lines as a function of cross-sectional area.

With reference to FIG. 2, a plot of resistivity (in $\mu\Omega$-cm) as a function of cross sectional area (in $nm^2$) is illustrated for both Copper metal lines. Specifically, plot 206 represents resistivity of Copper on a tantalum (Ta) substrate, while plots 202 and 204 represent resistivity of Tungsten on Ta and $SiO_2$ substrates respectively. As seen, resistivity of Copper increases dramatically when the cross sectional area is lowered, particularly in the area marked 208. On the other hand, resistivity of Tungsten remains relatively stable (especially for plot 202 pertaining to Tungsten on Ta) for shrinking cross-sectional areas, even though the bulk resistivity of Tungsten is higher than that of Copper. However, the higher bulk resistivity is a beneficial tradeoff given the smaller mean free path (which leads to higher electromigration reliability and higher resistance to electromigration and stress migration). Additionally, elements such as Tungsten, Molybdenum, and Ruthenium also display characteristics of higher melting points (W is about 3.1 times that of Cu, Mo is about 2.4 times that of Cu, and Ru is about 2.3 times that of Cu) and lower diffusivity.

Figure 3:
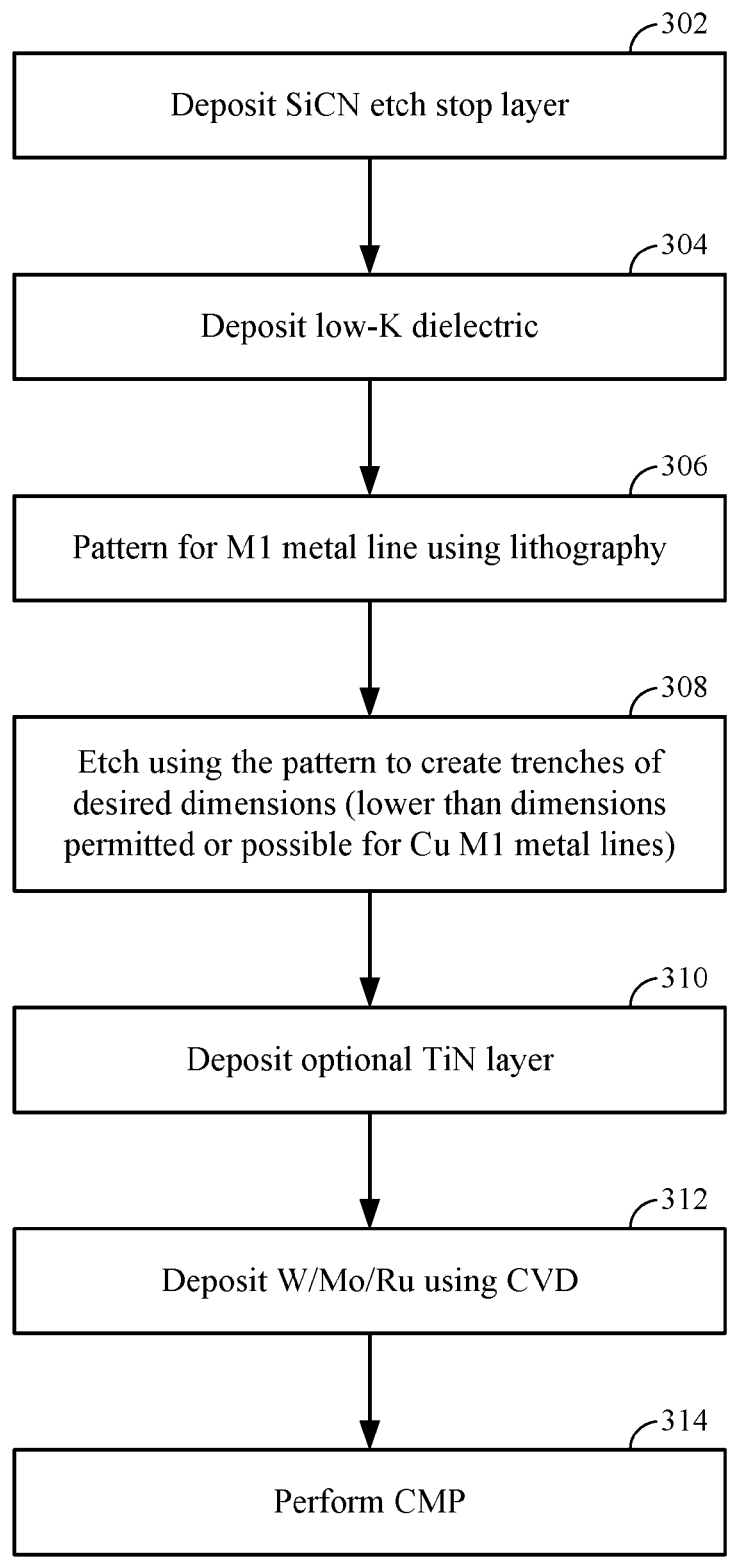
FIG. 3 is a flow chart illustrating a method of forming an exemplary M1 metal line.

It will be appreciated that embodiments include various methods for performing the processes, functions and/or algorithms disclosed herein. For example, as illustrated in FIG. 3, an embodiment can include a method of forming an M1 metal line (e.g., M1 metal line 102) from a material such as Tungsten (W). The method can include depositing a SiCN etch stop layer over a substrate, for example—Block 302. A dielectric layer with low dielectric constant (i.e., a low-K dielectric material) can be deposited—Block 304. A pattern for the intended M1 metal line can then be created using lithography—Block 306. Etching can be performed using the created pattern for the M1 metal line to form trenches, where dimensions of the trench correspond to desired dimensions for the M1 metal lines 102 (e.g., with a lower height H than that possible or allowed by design rules for a Cu filling)—Block 308. An optional TiN liner can then be deposited—Block 310. It will be understood that in some aspects, formation of the exemplary M1 metal lines 102 can be a fluorine-free process using a W/Mo/Ru fluorine-free precursor, which can eliminate the need for the optional TiN liner. In such cases where the TiN liner is not used, the method of forming the M1 metal line is simplified and resistance of M1 metal lines formed in this manner tend to be even lower. Using a chemical vapor deposition (CVD) process, the trenches can be filled with exemplary materials for formation of exemplary M1 metal lines 102, where the exemplary materials can comprise one of Tungsten (W), Molybdenum (Mo), or Ruthenium (Ru), or a combination thereof (it will be appreciated that unlike conventional Cu filling processes which may impose design rule limitations on sizes, the exemplary CVD process for filling the trenches can achieve desired dimensions for filling M1 metal lines of smaller dimensions than usually permitted for M1 metal lines made of Cu)—Block 312. Chemical-mechanical polishing (CMP) is then performed on the exemplary M1 metal line deposited using CVD—Block 314.

Thus, the design rule limitations on minimum size requirements can be overcome and exemplary M1 metal lines 102 can be formed of lower height than is possible or specified for conventional M1 metal lines made of Cu. In addition to decreasing the height H, in some embodiments, the width of the exemplary M1 metal lines 102 can also be reduced. More specifically, using exemplary processes, it is possible to form M1 metal lines 102 from Tungsten of very small widths, for example, widths less than 30 nm (which cannot be achieved in conventional M1 metal lines using Cu). Thus, width of the reduced height M1 metal line 102 can be smaller than a minimum allowed width of a conventional M1 metal line formed of Copper.

In some embodiments, additional advantages are seen by skipping a seed layer which is typically used in a conventional BEOL process of forming M1 metal lines using Cu. Accordingly, omission of such a seed layer can vacate more room for forming the M1 metal lines 102 from W, Mo, or Ru, increasing the effective volume of M1 metal lines 102 and thereby minimizing the increase of resistance in exemplary M1 metal lines (as seen from the expression for resistance $R_{BEOL}$ above, increasing volume, which is proportional to the product H*W, leads to lower resistance).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a M1 metal line of reduced RC delay and improved electromigration reliability. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of forming an M1 metal line in an integrated circuit, the method comprising:
    depositing a SiCN etch stop layer over a substrate;
    depositing a dielectric layer of low dielectric constant on the substrate;
    patterning the dielectric layer based on desired dimensions for the M1 metal line;
    etching a trench based on the pattern, wherein a dimension of the trench corresponds to the desired dimensions for the M1 metal line, and wherein the trench does not include a seed layer; and
    depositing a material for the M1 metal line in the trench, wherein the dimensions for the M1 metal line include a height smaller than a height for a M1 metal line formed of Copper, and a length of the M1 metal line is smaller than a minimum allowable length of a M1 metal line formed of Copper, wherein the material for the reduced height M1 metal line comprises Tungsten (W), Molybdenum (Mo), Ruthenium (Ru), or a combination thereof.

2. The method of claim 1, wherein the patterning is performed based on lithography.

3. The method of claim 1, wherein depositing the material for the M1 metal line is performed in a fluorine-free process.

4. The method of claim 1, wherein depositing the material for the M1 metal line is based on chemical vapor deposition (CVD).

5. The method of claim 1, further comprising performing chemical-mechanical polishing (CMP) after depositing the material for the M1 metal line.

* * * * *